United States Patent
Zampetti et al.

(10) Patent No.: US 7,535,931 B1
(45) Date of Patent: May 19, 2009

(54) TWO-WAY TIMING PROTOCOL

(75) Inventors: George P. Zampetti, Livermore, CA (US); Robert P. Hamilton, Sunnyvale, CA (US)

(73) Assignee: Symmetricom, Inc., San Jose, CA (US)

( * ) Notice: Subject to any disclaimer, the term of this patent is extended or adjusted under 35 U.S.C. 154(b) by 873 days.

(21) Appl. No.: 10/891,411

(22) Filed: Jul. 14, 2004

Related U.S. Application Data

(60) Provisional application No. 60/486,965, filed on Jul. 14, 2003, provisional application No. 60/577,675, filed on Jun. 7, 2004.

(51) Int. Cl.
    H04J 3/06 (2006.01)
(52) U.S. Cl. .................. 370/508; 370/507; 370/252; 370/519
(58) Field of Classification Search ................. 370/509, 370/350, 516, 503, 507, 510, 517, 518, 519, 370/508, 252
See application file for complete search history.

(56) References Cited

U.S. PATENT DOCUMENTS

| | | | | | |
|---|---|---|---|---|---|
| 5,959,982 | A | * | 9/1999 | Federkins et al. ........... 370/336 |
| 5,987,023 | A | * | 11/1999 | Albrow et al. .............. 370/350 |
| 6,442,177 | B1 | * | 8/2002 | DeBray ...................... 370/505 |
| 6,518,811 | B1 | * | 2/2003 | Klecka, III .................. 327/276 |
| 7,050,420 | B2 | * | 5/2006 | Findikli ...................... 370/350 |

* cited by examiner

*Primary Examiner*—Ricky Ngo
*Assistant Examiner*—David Oveissi
(74) *Attorney, Agent, or Firm*—Patterson & Sheridan, LLP

(57) ABSTRACT

A two-way time transfer protocol includes: sending a signal from a first node including a first clock and a first time interval counter coupled to the first clock over a transport physical layer coupled to the first node to a second node coupled to the transport physical layer, the second node including a second clock and a second time interval counter coupled to the second clock; then sending a last second node time interval counter value from the second time interval counter of the second node over the transport physical layer to the first node; and then comparing at the first node a last first node time interval counter value to the last second node time interval counter value. A first-way path latency from the first node to the second node is substantially equal to a second-way path latency from the second node to the first node, and all of a first node transmit delay, a first node receive delay, a second node transmit delay and a second node receive delay are substantially constant.

10 Claims, 10 Drawing Sheets

Two-Way Time Transfer Concept $d_{TS}$: Transmit Server Delay
$d_{TC}$: Transmit Client Delay
$d_{RS}$: Receive Server Delay
$d_{RC}$: Receive Client Delay
$d_{SC}$: Physical Layer Server to Client Delay
$d_{CS}$: Physical Layer Client to Server Delay
S: Server Clock Time
C: Client Clock Time

| Address | | Write Register | | Read Register |
|---|---|---|---|---|
| 0X00 | | Control Register 1 | | Control Register 1 |
| | Bit 0 | Lock 2.048 & 1.544MHz | Bit 0 | Lock 2.048 & 1.544MHz |
| | Bit 1 | PP2S Mask | Bit 1 | PP2S Mask |
| | Bit 2 | Freerun | Bit 2 | Freerun |
| | Bit 3 | Holdover | Bit 3 | Holdover |
| | Bit 4 | GPS/8Khz mode 1=8KHz | Bit 4 | GPS/8Khz mode 1=8KHz |
| | Bit 5 | | Bit 5 | |
| | Bit 6 | | Bit 6 | |
| | Bit 7 | | Bit 7 | |
| 0X01 | | Control Register 2 | | Control Register 2 |
| | Bit 0 | PLL unlock clear | Bit 0 | PLL unlock clear |
| | Bit 1 | PPS Align | Bit 1 | PPS Align |
| | Bit 2 | | Bit 2 | |
| | Bit 3 | | Bit 3 | |
| | Bit 4 | | Bit 4 | |
| | Bit 5 | | Bit 5 | |
| | Bit 6 | | Bit 6 | |
| | Bit 7 | | Bit 7 | |
| 0X02 | | Control Register 3 | | Control Register 3 |
| 0X03 | | | | Status Register 1 (IPLLs) |
| | | | Bit 0 | 8 KHz reference LOS |
| | | | Bit 1 | 8 KHz reference phase error |
| | | | Bit 2 | 8 KHz reference IPLL not settled |
| | | | Bit 3 | 8 KHz reference frequency error |
| | | | Bit 4 | Unlock 58MHz PLL |
| | | | Bit 5 | Unlock 78MHz PLL |
| | | | Bit 6 | LOS 58MHz VCXO |
| | | | Bit 7 | LOS 78MHz VCXO |
| 0X04 | | | | Status Register 2 |
| | | | Bit 0 | |
| | | | Bit 1 | Holdover |
| | | | Bit 2 | MPLL Ext_lock |
| | | | Bit 3 | MPLL Tight_lock |
| | | | Bit 4 | |
| | | | Bit 5 | |
| | | | Bit 6 | |
| | | | Bit 7 | |
| 0X05 | | | | Status Register 3 |
| | | | Bit 0 | Upstream Loss of frame |
| | | | Bit 1 | Downstream Loss of frame |
| | | | Bit 2 | |
| | | | Bit 3 | |
| | | | Bit 4 | PPS_Time |
| | | | Bit 5 | |
| | | | Bit 6 | |
| | | | Bit 7 | |
| 0X06 | | 2-way Comms Control | | 2-Way Comms Status |
| | Bit 0 | Not used | Bit 0 | Upstream UART RX FIFO empty |
| | Bit 1 | Not used | Bit 1 | Upstream UART TX FIFO full |
| | Bit 2 | Not used | Bit 2 | Upstream SDLC RX FIFO empty |
| | Bit 3 | Not used | Bit 3 | Upstream SDLC TX FIFO full |
| | Bit 4 | Not used | Bit 4 | Downstream SDLC RX FIFO empty |
| | Bit 5 | Not used | Bit 5 | Downstream SDLC TX FIFO full |
| | Bit 6 | Upstream SDLC Transmit Enable | Bit 6 | |
| | Bit 7 | Downstream SDLC Transmit Enable | Bit 7 | |

Fig. 7A

| Address | | Write Register | | Read Register | |
|---|---|---|---|---|---|
| 0X07 | | Upstream UART Transmit data | | Upstream UART Receive data | |
| 0X08 | | Upstream SDLC Transmit data | | Upstream SDLC Receive data | |
| 0X09 | | Downstream SDLC Transmit data | | Downstream SDLC Receive data | |
| 0X0A | | | | INTERRUPT COUNTER This is an 8 bit counter that is incremented on every 25mS interrupt. The microprocessor can check this counter to see if any interrupts have been missed. | |
| 0X0B | | Upstream Type (To send to Upstream unit) | | Upstream Type (Received from Upstream unit) | |
| 0X0C | | Upstream Status (To send to Upstream unit) | | Upstream Status (Received from Upstream unit) | |
| 0X0D | | Not Used | | Not Used | |
| 0X0E 0X0F | | | | Upstream Received Phase correction (From Upstream unit) | |
| 0X10 | | | | Upstream Dither (From Upstream unit) | |
| 0X11 | | Upstream Spare byte (To Upstream unit) | | Upstream Spare byte (From Upstream unit) | |
| 0X12 | | Downstream Type (To Downstream unit) | | Downstream Type (From Downstream unit) | |
| 0X13 | | Downstream Status (To Downstream unit) | | Downstream Status (From Downstream unit) | |
| 0X14 0X15 | | | | | |
| 0X16 | | | | | |
| 0X17 | | Not used | | Not used | |
| 0X18 0X19 | | | | Downstream Received phase error | |
| 0X1A | | Downstream Spare byte (To Downstream unit) | | Downstream Spare byte (From Downstream unit) | |
| 0X1B | | Not used | | Not used | |
| 0X1C 0X1D | 16 bit | EFC Value (Only in 8KHz mode) | 16 bit | EFC Value | |
| 0X1E 0X1F | | | | 8 KHz input phase 1=New phase data available Phase(14:0) | |
| 0X20 0X21 | | This has been updated when bit 4 at address 0x11 is high. | Bit 15 Bit 14:0 | GPS Phase Measurement Too Far When set to 1 Phase is out measurement range GPS Phase Signed value in 39.3216MHz clock cycles. | |
| 0x3F | | | | FPGA Revision | |

Fig. 7B

| Signal Name | Descripton | Pin No. | Pin type |
|---|---|---|---|
| CLK58M | Chip * 48 clock (VCXO) | | IN |
| CLK78M | Chip * 64 clock (VCX0) | | IN |
| REF10M | 10 MHz | | IN |
| CLK53M | 53.125 MHz sampling clock | | IN |
| 8K_P | Differential receive 8 KHz sync, positive | | LVDS IN |
| 8K_N | Differential receive 8 KHz sync, negative | | LVDS IN |
| U_RX0 | Upstream 2 way receive ADC LSB | | IN |
| U_RX1 | Upstream 2 way receive ADC | | IN |
| U_RX2 | Upstream 2 way receive ADC | | IN |
| U_RX3 | Upstream 2 way receive ADC | | IN |
| U_RX4 | Upstream 2 way receive ADC | | IN |
| U_RX5 | Upstream 2 way receive ADC | | IN |
| U_RX6 | Upstream 2 way receive ADC | | IN |
| U_RX7 | Upstream 2 way receive ADC MSB | | IN |
| D_RX0 | Downstream 2 way receive ADC LSB | | IN |
| D_RX1 | Downstream 2 way receive ADC | | IN |
| D_RX2 | Downstream 2 way receive ADC | | IN |
| D_RX3 | Downstream 2 way receive ADC | | IN |
| D_RX4 | Downstream 2 way receive ADC | | IN |
| D_RX5 | Downstream 2 way receive ADC | | IN |
| D_RX6 | Downstream 2 way receive ADC | | IN |
| D_RX7 | Downstream 2 way receive ADC MSB | | IN |
| ADCLK | 53.125MHz sample clock to A to D converters | | OUT |
| D0 | Microprocessor data bus LSB | | INOUT |
| D1 | Microprocessor data bus | | INOUT |
| D2 | Microprocessor data bus | | INOUT |
| D3 | Microprocessor data bus | | INOUT |
| D4 | Microprocessor data bus | | INOUT |
| D5 | Microprocessor data bus | | INOUT |
| D6 | Microprocessor data bus | | INOUT |
| D7 | Microprocessor data bus MSB | | INOUT |
| A0 | Microprocessor address bus LSB | | IN |
| A1 | Microprocessor address bus | | IN |
| A2 | Microprocessor address bus | | IN |
| A3 | Microprocessor address bus | | IN |
| A4 | Microprocessor address bus | | IN |

Fig. 8A

| Signal Name | Descripton | Pin No. | Pin type |
|---|---|---|---|
| A5 | Microprocessor address bus MSB | | IN |
| CS_N | Microprocessor chip select | | IN |
| OE_N | Microprocessor output enable for data bus | | IN |
| WR_N | Microprocessor write strobe | | IN |
| RESET | Asynchronous active low FPGA reset | | IN |
| ADV58M | Phase comparator output for 58.9825MHz VCXO | | OUT |
| RET58M | Phase comparator output for 58.9824MHz VCXO | | OUT |
| EFC | Delta Sigma DAC output for EFC control of 10MHz OCXO | | OUT |
| U_REF | Delta Sigma DAC output for Upstream 2-Way A to D converter | | OUT |
| D_REF | Delta Sigma DAC output for Downstram 2-Way A to D converter | | OUT |
| 2048M_P | 2.048 MHz output | | LVDS OUT |
| 2048M_N | 2.048 MHz output | | LVDS OUT |
| 1544M_P | 1.544 MHz output | | LVDS OUT |
| 1544M_N | 1.544 MHz output | | LVDS OUT |
| 58M_P | 58.9824 MHz output | | LVDS OUT |
| 58M_N | 58.9824 MHz output | | LVDS OUT |
| PP2S_P | Pulse per 2 second output | | LVDS OUT |
| PP2S_N | Pulse per 2 second output | | LVDS OUT |
| PPS_OUT | Pulse per second test point | | OUT |
| U_TX1 | Upstream 2-Way transmitter signal | | OUT |
| U_TX2 | Upstream 2-Way transmitter signal | | OUT |
| D_TX1 | Downstream 2-Way transmitter signal | | OUT |
| D_TX2 | Downstream 2-Way transmitter signal | | OUT |
| IRQ1 | Microprocessor interrupt 1 | | OUT |
| IRQ2 | Microprocessor interrupt 2 | | OUT |
| ADV78M | Phase comparator output for 78.6432 MHz VCXO | | OUT |
| RET78M | Phase comparator output for 78.6432 MHz VCXO | | OUT |
| 78M_P | 78.6432 MHz output | | OUT |
| 78M_N | 78.6432 MHz output | | OUT |
| ICS_REF | Reference clock to ICS PLL chip for sample clock | | OUT |
| SPARE1 | Spare pin for debug purpose | | INOUT |
| SPARE2 | Spare pin for debug purpose | | INOUT |
| SPARE3 | Spare pin for debug purpose | | INOUT |
| SPARE4 | Spare pin for debug purpose | | INOUT |

Fig. 8B

TWO-WAY TIMING PROTOCOL

CROSS-REFERENCES TO RELATED APPLICATIONS

This application is related to, and claims a benefit of priority under 35 U.S.C. 119(e) from copending provisional patent application U.S. Ser. Nos. 60/486,965 filed Jul. 14, 2003; and 60/577,675 filed Jun. 7, 2004, the entire contents of both of which are hereby expressly incorporated herein by reference for all purposes.

BACKGROUND INFORMATION

1. Field of the Invention

The invention relates generally to the field of network synchronization. More particularly, an embodiment of the invention relates to methods of and/or apparatus for providing a two-way timing protocol.

2. Discussion of the Related Art

Referring to FIG. 1A, the legacy interoffice distribution approach utilized two external synchronization references from equal or higher stratum offices providing traceability back to a sparse set of stratum 1 offices. This tree topology introduces multiple transmission links, network element clocks and Building Integrated Timing Supplies (BITS) into a primary and secondary path. A myriad of issues jeopardize the performance of this "send and pray" distribution approach.

First, the path quality is limited by the "weakest link". One poorly performing clock could degrade the entire downstream path. Recent improvement in Stratum 3E oscillator screening have shown that over 10% of the older systems could have bad actor oscillators, and that this problem is likely pervasive in telephony. Frequent transmission path switching can severely degrade a clock even though it reports normal operation. Also, the wide distribution in oscillator performance from like unit to like unit, results in some level of bad acting oscillators in the network. Simplistic synchronization messaging schemes (SONET/SDH) do not adequate address the marginal performance issues.

Second, the distribution is inherently non-traceable. The principle stratum distribution rule of only receiving timing from clocks of equal or higher stratum level cannot be guaranteed. Even more insidious is the danger of receiving timing from a path that already includes the "receiving clock". Known as a timing loop, this can occur as simply as setting the "near/far" timing mode of network element such as a echo canceller wrong so that timing is send back along the same path. Timing loops generate slowly increasing degradation and are difficult to detect and resolve.

Third, path diversity cannot be assured. Shared resources such as clocks, routes, cables, and offices along two supposedly independent paths to a stratum 1 source are common. The interdependence of a primary and secondary reference will not only reduce reference availability, but can aggravate performance problems as clocks continuously switch reference inputs.

Referring to FIG. 1B, the interoffice synchronization distribution problems discussed above were the impetus for the trend to more PRS (primary reference standard) systems in the network. A properly designed PRS provides direct traceability to UTC time and serves as a firewall protecting the Central Office from external synchronization "viruses". Each generation of PRS systems permits more cost effective utilization in the network.

The Bell System Reference Frequency Supply is characteristic of the original PRS approach. The design was based on multiple primary clocks, a voting system and a UTC monitoring system. The system was expensive at approximately $250,000 at the time and, therefore, designed for limited application. In fact, the original slip rate standard (G.822) only anticipates a maximum of 14 such "plesiochronous stratum 1 systems" in an international end-to-end connection.

The next step in the evolution of PRS architecture was the introduction of UTC (universal time coordinated) traceable system utilizing non-cesium oscillators as flywheels. This approach gained credence in the standards with the introduction of the term Primary Reference Clock (PRC) or equivalently Primary Reference Source (PRS). ANSI T10.101 was the first standard to define a PRC (PRS) as a UTC traceable clock using either Cesium or other local oscillators. AT&T replaced the BSRF Supply with 18 regional PRS systems using GPS and Rubidium coincident with its upgrade to a digital fiber backbone. Sprint and MCI used similar systems based on Loran-C traceability. The systems were not tightly integrated and required costly installation of rooftop antenna and cable systems. More refinements on this approach such as re-utilization of existing TSG oscillators and designs to extend antenna cable distance permitted the penetration of the PRS into the core backbone networks during the 90s. The current generation PRS in systems such as the TS3xxx and OT-21, have eliminated the need for a rooftop antenna system in many applications. However, the systems still require an antenna system mounting externally on an outside wall or on certain windows. The need for special antenna installation although significantly reduced is not eliminated. However, this reduction is permitting the introduction of PRS system in many more central offices. What is needed is an approach that will permit the introduction of PRS systems in all central offices, and inter-office, and also intra-office (e.g., with a customer premises).

A time transfer protocol can be operated at various layers of a communication protocol. For example, many are familiar with Network Timing Protocol (NTP). The NTP protocol is commonly used in an IP network to establish a best effort transfer of time of day. Although NTP attempts to determine transport delay using a two-way approach, the performance is limited by the lack of reciprocity in path latency on each direction. This is a basic limitation of supporting a datagram type routing through a network with dynamic loads. As are result while NTP can typically support relatively coarse millisecond time accuracies, it has no capability of assuring even this level of accuracy, much less anything precise.

In an attempt to address the deficiencies of NTP, there have been previous efforts to constrain the path delay. For example a layer 2 based protocol would theoretically substantially eliminate the network routing effects. One example of such a protocol is the recently adopted IEEE 1588™ precise timing protocol. The primary advance is that 1588™ is constrained to be non-routed. Packet time stamping is to be performed as close to the physical layer as possible, and layer 2 switching between clocks is anticipated. This standard supports up to one two-way transaction per second and is capable of better than 1 microsecond timing performance.

Heretofore, the requirement(s) of obviating the need for all external GPS antennas, enabling the installation of economical PRS systems in all offices, providing greater accuracy and precision and ensuring compatibility with legacy balance of plant interconnects have not been fully met. What is needed is a solution that simultaneously solves all of these problems.

SUMMARY OF THE INVENTION

There is a need for the following embodiments of the invention. Of course, the invention is not limited to these embodiments.

According to an embodiment of the invention, a method comprising a two-way time transfer protocol includes: sending a signal from a first node including a first clock and a first time interval counter coupled to the first clock over a transport physical layer coupled to the first node to a second node coupled to the transport physical layer, the second node including a second clock and a second time interval counter coupled to the second clock; then sending a last second node time interval counter value from the second time interval counter of the second node over the transport physical layer to the first node; and then comparing at the first node a last first node time interval counter value to the last second node time interval counter value, wherein i) a first-way path latency from the first node to the second node is substantially equal to a second-way path latency from the second node to the first node, and ii) all of a first node transmit delay, a first node receive delay, a second node transmit delay and a second node receive delay are substantially constant.

According to another embodiment of the invention, an apparatus comprising a two-way time transfer network link includes: a first node including a first clock and a first time interval counter coupled to the first clock; a transport physical layer coupled to the first node; and a second node coupled to the transport physical layer, the second node including a second clock and a second time interval counter coupled to the second clock, wherein i) the second node sends a last second node time interval counter value from the second time interval counter to the first node, ii) the first node compares a last first node time interval counter value to the last second node time interval counter value, iii) a first-way path latency from the first node to the second node is substantially equal to a second-way path latency from the second node to the first node, and iv) all of a first node transmit delay, a first node receive delay, a second node transmit delay and a second node receive delay are substantially constant.

According to another embodiment of the invention, an article of manufacture comprising computer or machine readable program elements translatable for implementing a method including a two-way time transfer protocol includes: sending a signal from a first node including a first clock and a first time interval counter coupled to the first clock over a transport physical layer coupled to the first node to a second node coupled to the transport physical layer, the second node including a second clock and a second time interval counter coupled to the second clock; then sending a last second node time interval counter value from the second time interval counter of the second node over the transport physical layer to the first node; and then comparing at the first node a last first node time interval counter value to the last second node time interval counter value, wherein i) a first-way path latency from the first node to the second node is substantially equal to a second-way path latency from the second node to the first node, and ii) all of a first node transmit delay, a first node receive delay, a second node transmit delay and a second node receive delay are substantially constant.

These, and other, embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of an embodiment of the invention without departing from the spirit thereof, and embodiments of the invention include all such substitutions, modifications, additions and/or rearrangements.

BRIEF DESCRIPTION OF THE DRAWINGS

The drawings accompanying and forming part of this specification are included to depict certain embodiments of the invention. A clearer conception of embodiments of the invention, and of the components combinable with, and operation of systems provided with, embodiments of the invention, will become more readily apparent by referring to the exemplary, and therefore nonlimiting, embodiments illustrated in the drawings, wherein identical reference numerals (if they occur in more than one view) designate the same elements. Embodiments of the invention may be better understood by reference to one or more of these drawings in combination with the description presented herein. It should be noted that the features illustrated in the drawings are not necessarily drawn to scale.

FIGS. 7A-7B are partial figures intended to form one complete figure that illustrates a tabular view of a microprocessor register map, representing an embodiment of the invention.

FIGS. 8A-8B are partial figures intended to form one complete figure that illustrates a tabular view of pin descriptions for a field programmable gate array, representing an embodiment of the invention.

DESCRIPTION OF PREFERRED EMBODIMENTS

Figure 1A:
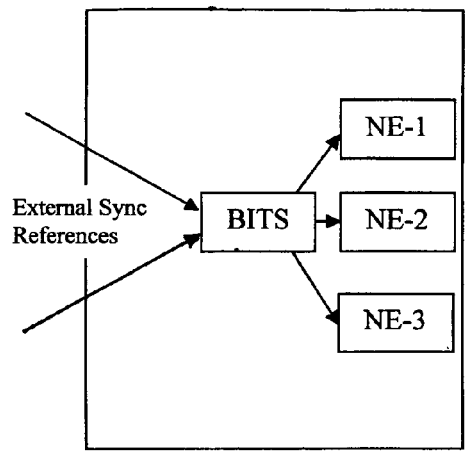
FIGS. 1A-1B are block schematic views illustrating legacy and current synchronization distribution schemes, appropriately labeled "PRIOR ART."
Figure 1B:
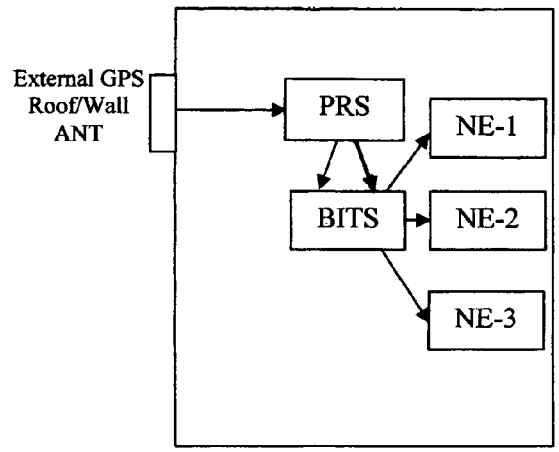

Embodiments of the invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the embodiments of the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this disclosure.

The below-referenced U.S. patents disclose embodiments that are useful for the purposes for which they are intended. The entire contents of U.S. Pat. Nos. 5,457,729; 5,646,519; 5,666,330; 5,751,777; 6,166,608; 6,512,803; 6,549,604; 6,742,835; and 6,765,424 are hereby expressly incorporated by reference herein for all purposes.

The utilization of a single ended transfer of synchronization utilizing either a DS1/E1/2048 or CC has been the workhorse standard for intra-building synchronization for over two decades. The utilization of an infrastructure source of common timing such as a Building Integrated Timing Supply (BITS) or Stand Alone Synchronization Element (SASE) in conjunction with these simple sync signals was a huge improvement to the ad-hoc sync arrangements prior to the introduction of BITS type intra-office sync. But, this approach is being stretched beyond its limits as large highly integrated network elements supporting tremendous traffic loads, demanding ultra-high stability and requiring time of day support are being introduced into the network. To support these systems the use of more robust, fail-safe, intra-building distribution will emerge as an important advance.

A next step in the evolution of interoffice distribution can include breaking the tie with the outdoor antenna by utilizing a true indoor GPS based timing antenna system. Based on high sensitivity GPS receiver designs optimized for timing applications, a compact "timing antenna" can be installed directly in a central office relay rack with no wall/window-mounted components. The generation GPS receivers can operate in both fully assisted and hybrid assisted modes. The hybrid-assisted mode is unique to timing applications. It will permit a timing antenna mounted in a relay rack near an outside central office wall to obtain infrequent ephemeris updates from stronger tracking intervals to extended the tracking time during weak intervals. In this manner, the timing antenna requires no external assist. In fully assisted mode, the timing antenna can be located throughout the central office. However, it may require a low data rate connection to an assist server within a protected intra-company network. The hybrid approach is particularly appealing as the timing antenna can be directional. Each floor of a central office can be provisioned with 2 or more timing antennas positioned near different outside walls. Each antenna can provide spatially independent satellite tracking and provide corresponding jamming immunity. The indoor timing antenna approach can also complement existing stand alone cesium clock offices supporting the required UTC (universal time coordinated) traceability.

Another next step in the evolution of interoffice distribution architecture can be the use of multiple sources of time and frequency for synchronization. The BesTime™ Synch Module input ensembling that is readily commercially available from Symmetricom, Inc. of San Jose, Calif. already supports optimal disciplining of a PRS intra-office source. The BesTime™ Sync Module from Symmetricom is designed to support CDMA 2000, W-CDMA (UMTS), GSM, EDGE, GPRS, WLL, Location Measurement Units (LMU) and other wireless base station technologies. The BesTime™ Sync Module from Symmetricom allows (wireless) base stations the capability of utilizing multiple sources of time and frequency for synchronization. The BesTime™ Sync Module from Symmetricom so provides these OEM products with the ability to produce extended holdover when using span lines in the holdover mode of operation. The BesTime™ Sync Module from Symmetricom has the capability to use multiple input sources from time and frequency references to adaptively generate and output timescale frequency that operates with a stability that is better than any of the individual sources used (U.S. Pat. No. 6,765,424). These multiple input sources may be a cesium standard, the GPS Satellite System, a local oscillator, or T1/E1 lines. This improves the locked performance of frequency and time applications while extending their holdover performance. Extended holdover greater than 48 hours with accuracies of less than 4 micro seconds can be achieved when a E1/T1 line is used as the primary holdover reference for GPS based receivers. Also multiple inputs can be supported by other readily commercially available synchronization supply units, such as for example the Time-Hub™, SSU2000™ and TimeProvider™ products from Symmetricom of San Jose, Calif., all three of which are synchronization supply units that can support at least two T1/E1 inputs.

Another next step in the evolution of interoffice distribution architecture can be the use of a central/inter/intra-office timing interface (two-way timing protocol). This interface (two-way timing protocol) is discussed in great detail below and can enable delivery of precise and verified time of day (and frequency) utilizing the existing T1/E1 (G.703) physical layer. Embodiment of the invention can utilize a single wire pair connection in a half duplex ping-pong manner. This enables verification of timing delivery and precision to the nanosecond level. By using the same T1/E1 physical layer, the interface can be supported (combined) in the context of the latest generation of core central office equipment.

Figure 1C:
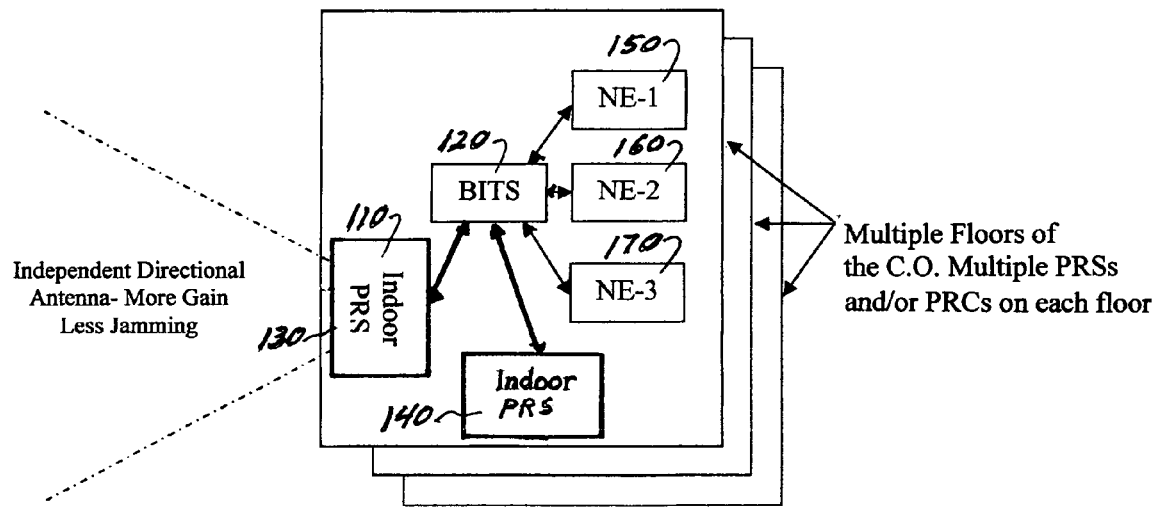
FIG. 1C is a block schematic view illustrating indoor multiple PRS two-way timing distribution, representing an embodiment of the invention.

Referring to FIG. 1C, an embodiment of the invention is depicted that includes a multi-level two-way timing interface (two-way timing protocol) based on a pair of indoor primary reference standards, one of which utilizes an independent directional antenna for more gain and less jamming. A first indoor primary reference standard 110 is two-way protocol coupled to a building integrated timing standard 120. The first indoor primary reference standard is also coupled to an independent directional antenna 130. A second indoor primary reference standard 140 is two-way protocol coupled to the building integrated timing standard 120. Three network elements 150, 160, 170 are two-way protocol coupled to the building integrated timing standard 120. The parallel primary reference standard inputs are extended beyond the building integrated timing standard 120 to the three network elements 150, 160, 170I. Although the depicted example shows two levels beneath the building integrated timing standard 120, embodiments of the invention can include 3, 4, . . . 10 or more (potentially many more) levels, as well as interoffice connections. Further, the two-way timing protocol can be implemented in any context, on any number of floors and with any number of primary reference standards. In general, the combination of two-way timing protocol with multiple timing inputs (optionally with 2 or more spatially independent (e.g., hybrid assisted) antennas) is a preferred embodiment of the invention and a significant commercial context (application) for the invention. BesTime™ class input ensembling can be performed to maximize the benefit of multiple timing antennas. Embodiments of the invention including two-way time transfer techniques can be deployed that will provide many enhancements. Before discussing these enhancements it is useful to disclose the generic concept of two-way time transfer.

Two-Way Timing Protocol Overview

In telephony, frequency distribution has historically been based on single ended or "one-way" distribution from the master (server) to the slave (client). Metaphorically, the synchronization flows from the root of an upside down spanning tree to each of the clocks in a cascaded fashion that follows a strict stratification (along the branches). A clock of a given stratum level can only receive timing from a clock of equal or higher (lower numerical value) stratum level. The timing network is intrinsically operating in an open loop mode as there is no provision the provide feedback to ensure proper overall network operation. As a consequence the synchronization distribution network is vulnerable to error sources ranging from excessive re-arrangements and timing loops on the distribution paths to faulty clocks and oscillators in the nodes.

In contrast, two-way timing protocols are fundamentally different in that time (and indirectly frequency) is actively transferred in both directions. Before discussing the benefits of this enhancement it is useful to disclose in more detail the concept of two-way time transfer.

Figure 2:
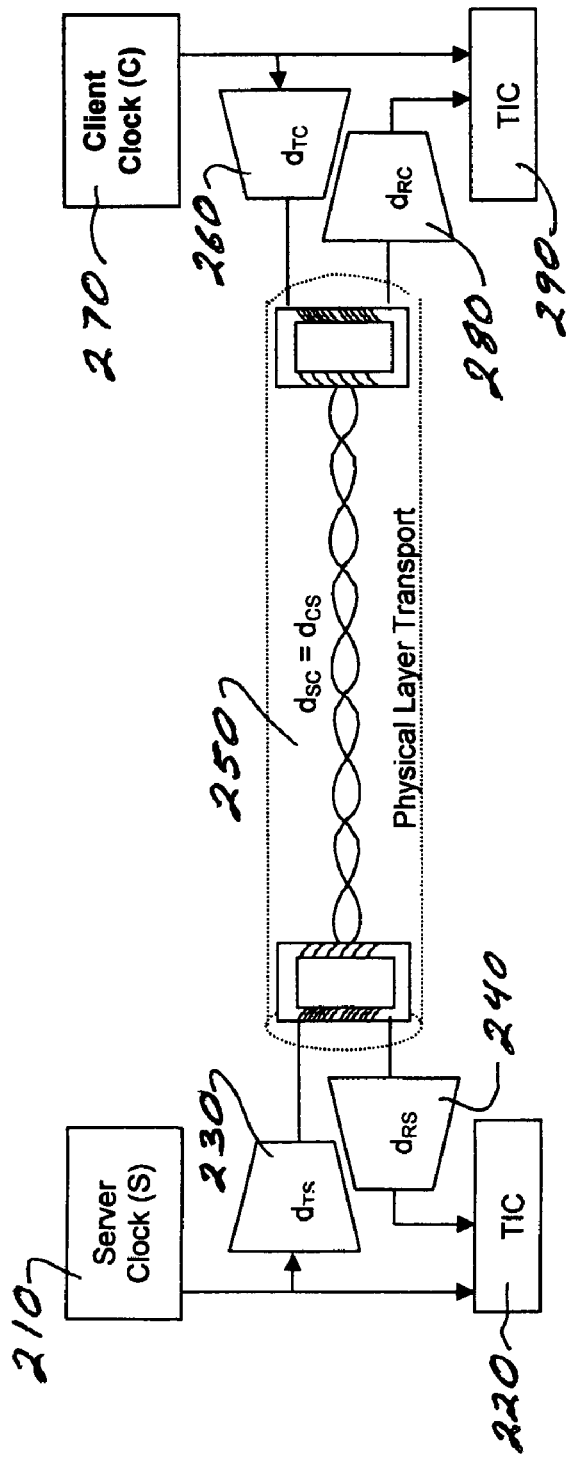
FIG. 2 is a block schematic view of a two-way time transfer protocol, representing an embodiment of the invention.

Referring to FIG. 2, an example of two-way time transfer operating at the physical level is illustrated. A server clock 210 is coupled to a server time interval counter 220. The server clock 210 is also coupled to a server transmitter block 230. The server time interval counter 220 is also coupled to a server receiver block 240. Together, the server clock 210, the server time interval counter 220, the server transmitter block 230 and the server receiver block 240 define a first node. The server transmitter block 230 and the server receiver block 240 are coupled to a physical layer transport 250. The physical layer transport 250 can be an ordinary twisted pair, a coax cable, an optical conductor (e.g., fiber, cable, free-space) or any other physical signal conduit. The physical layer transport 250 is coupled to a client transmitter block 260. The client transmitter block 260 is coupled to a client clock 270. The physical layer transport 250 is also coupled to a client receiver block 280. The client receiver block is coupled to a client time interval counter 290. The client time interval counter 290 is coupled to the client clock 270. Although the server is in this generic example is termed the first node and the client is termed the second node, this terminology is arbitrary and only for convenience; the demarcations first and second could be reversed, or in an alternative embodiment refer to members of a peer to peer network where the peers have only some or no function distinction(s). It is important to note that this generic approach can be extended to higher (other) levels in the hierarchy with certain benefits and tradeoffs.

The operation of two-way time transfer depicted in FIG. 2 will now be described. The same physical layer transport connection is used in a ping-pong fashion and so the transport delay is reciprocal. The TIC is a time interval counter which measured the receive signal with respect to the local clock. The values of the two counters are as follows:

$$TIC(Client)=S+dTS+dSC+dRC-C$$

$$TIC(Server)=C+dTC+dSC+dRS-S$$

As part of the ping-pong transaction the client sends the last TIC value to the server. The server can calculate an estimate of the cable delay as well as the time error of the client as follows:

$$[TIC(Client)+TIC(Server)]=2dSC+\{dTS+dTC+dRC+dRS\}$$

Since all the terms in brackets are fixed processing delays, they are known and subtracted out leaving only 2dSC. This is the round trip delay in the physical layer and ½ of the value is the cable delay measurement.

If we subtract the two counter values we can extract the time error as shown:

$$[TIC(Server)-TIC(Client)]=2(C-S)+\{dTC-dTS+dRS-dRC\}$$

Again the bracketed terms are known and can be removed. ½ of the remaining value is the time error of the client with respect to the server (C−S).

This interchange of timestamps provides two key benefits. First, it provides a way to verify that the transport channel latency is sufficiently stable and allows the elimination of time error between the two clocks. Second, it provides a continual verification that the client is properly locked to the master. There may be many variations to this basic transaction obvious to one of ordinary skill in the art after reading this application, but the key principles of continuously measuring the time error of the client, and verifying the physical layer transport delay are likely to remain the same. Also, multiple transactions may be used to effective filter out measurement quantization errors.

Embodiments of the invention can provide significant advantages by supporting a physical layer central/inter/intra-office protocol. To support the legacy physical interfaces the basic format of the timing signal can be compatible with both legacy IT1/E1 (G.703/GR499) physical layer transport as well as the growing Ethernet deployment. This will provide a significant level of build in compatibility with existing systems and compliance requirements. Also, the delivered performance level from this physical layer signal will exceed projected requirements by a significant margin as literally the same physical path is used in both directions.

Embodiments of the invention can enable the use of basic transfer of alternate mark inverted modulated burst to support an enhanced two-way ping-pong operation. Significantly, embodiments of the invention can include interfaces based on two wire half duplex to support the required two-way time transfer on existing central office cables as well as sharing of existing Ethernet cables on spare wire pairs. It is important to note that the two-way timing protocol can, therefore, be supported as an extension of the existing framing formats to ensure full legacy compatibility. The preferred embodiment described in more detail below can be easily implemented with portable VHDL code on FGPA and/or ASICs and achieve better than 10 ns transfer accuracy.

Some of the benefits of two-way timing protocol embodiments of the invention will now be described. The advancement to a central/inter/intra-building synchronization standard based on the two-way time transfer approach has significant benefits.

By using a G.703/GR499 standardized physical transport layer, the protocol can coexist with the large embedded base of T1/E1 intra-office synchronization distribution. A serving output card can be configured to generate either the or legacy protocol and there is no need to change backplanes, connectors or intra-office cables to support the protocol. This compatibility also enables the current generation of central office synchronization equipment to support the protocol with upgraded plug-ins.

The protocol achieves the convergence of the two "stratum hierarchies" deployed today. The traditional stratum clock hierarchy is used to distribute traceable frequency over physical layer telephony transport. The IP world introduced a stratum hierarchy to support the Network Timing Protocol. This distribution tree is designed to transport a limited precision time of day over the first three layers of the IP protocol stack.

The two-way protocol supports very precise time and frequency transfer over the well-established G.703/GR499 physical transport used throughout the Central Office environment. With the use of reciprocal two-way distribution, distribution delay error is virtually eliminated permitting time transfer up to 100,000 times better than current NTP.

Despite the growing availability of synchronization management systems, there has been only modest enthusiasm driving their use particularly in mature networks. One reason for this is the limited capability of these systems to actually ensure proper performance of the client clocks. No matter how consistent the master distribution shelf performs, if there are problems downstream in either the distribution paths, subtending clocks or the common equipment clock cards, synchronization performance is compromised. With the current single ended "send and pray" distribution approach, the performance of the client clock is unknown. As it is these lower end client clocks that are most likely to have operational issues, this is a major limitation in the current methodology.

There is growing evidence that the current intra-office timing distribution is inadequate. The Network Reliability Steering Committee prepared a report in the role of timing outages in FCC reportable network events during 2000-2001. One key finding is that 9.4% of all FCC reportable outages are timing related. The two-way protocol embodiments of the invention enable a more comprehensive synchronization system with the capability of ensuring proper quality of service for both time and frequency at the output of the critical client clocks.

As already mentioned the two-way protocol is not restricted to telephony cabling. The two-way protocol provides the capability to achieve ultra-stable transport of time and frequency over Ethernet cabling systems. By utilizing a spare wire pair in the cable the protocol can over the same cable supporting Ethernet traffic. The two-way protocol embodiments of the invention are a cost effective method to distribute time and frequency in Ethernet based system such as enterprise VOIP and enterprise wireless application. The synchronization distribution will provide a cost effective approach to improving the quality of service of these enterprise systems. The single twisted pair implementation of the two-way protocol achieves optimal physical layer reciprocity. The ultra high transaction rate eliminates measurement error and supports fast error detection.

There are many variations of this two-way protocol embodiment of the invention, but the key principle of continuously measuring the time error of the client, and verifying the physical layer transport delay can remain the same. Also, multiple transactions may be used to effective filter out measurement quantization errors.

As noted above, a preferred embodiment of the invention supports legacy interfaces by providing a basic format of the timing signal that is compatible with, for example, a T1/E1 (G.703) physical layer. This will provide a significant level of build in compatibility with existing systems and compliance requirements. The performance delivered from such a physical layer signal will exceed minimum requirements by a significant margin. As also noted above, a preferred embodiment of the invention can be based on transfer of alternate mark inverted modulated burst to support the enhanced two-way ping-pong operation. The interfaces can be 2-wire half duplex to support the required two-way time transfer.

The Core Sync Technology based FGPA will be enhanced to support the protocol at layer 2 and hand-off a layer a 3 packet interface to an optional host. The protocol will support a high level of transactions (~1000 per second) and a high-speed global clock ~155 MHz with an objective of 1 ns time transfer to a client module. The server interface can support the legacy T1/E1 sync interfaces as well.

The large installed base of equipment should be supported so that an upgrade path is available but not imposed on all legacy interfaces. By using a G.703 compatible physical transport layer, the two-way timing protocol can coexist with the large embedded base of T1/E1 intra-office synchronization distribution. A serving output card can be configured to generate either a legacy protocol or the two-way timing protocol and there is no need to change backplanes, connectors or intra-office cables to support the protocol.

The two-way protocol enables advancement from relative to absolute time of day and the inherent benefits of a global standard timescale. The two-way protocol enables synchronization quality of service (QOS) to be extended deep into deployed networks. The two-way protocol enables a more comprehensive synchronization system with the capability of ensuring proper quality of service for both time and frequency at the output of the critical client clocks.

The synchronization QOS capabilities of the protocol are evident in at least the following three areas. First, there is an improvement in the quality of service improvement in the area of continual verification that the client network element is actual receiving the infrastructure synchronization. Second, there is an improvement in the quality of service improvement in the area of performance monitoring at the BITS/SASE can be extended to include the client clocks measuring the real time performance of all client clocks. Third, there is an improvement in the quality of service improvement in the area of advanced telemetry of BITS performance to the client will enhance reference management.

The two-way protocol also provides a secure distribution capability. One significant benefit of the two-way protocol is the opportunity to define a much-needed set of layer 3 security features. The capability to support authenticated path traceability information is a centerpiece of the security features.

The two-way protocol has a many synchronization distribution applications. The two-way distribution protocol combined with other recent readily commercially available technology advances including: BesTime™, Core Sync Technology, and Compact Rubidium from Symmetricom will enable a number of synchronization applications in the telecom market space. The following applications, while not exhaustive, present the scope of the market potential.

The two way timing protocol is useful in providing a robust central office synchronization distribution. The invention can be further appreciated in contrast to other central office common infrastructure systems. Such systems are classified as power, distribution frames or equipment building systems. See Engineering and Operations in the Bell System, 2nd edition, chapter 12. Synchronization was not originally viewed as a central office infrastructure system. In fact, the original BITS approach allowed offices to "piggy back" on a major system such as the 4ESS in AT&T in conjunction with same ancillary distribution equipment. However, the BITS concept is now firmly rooted domestically, and the equivalent SASE application is slowly gaining acceptance internationally.

Figure 3:
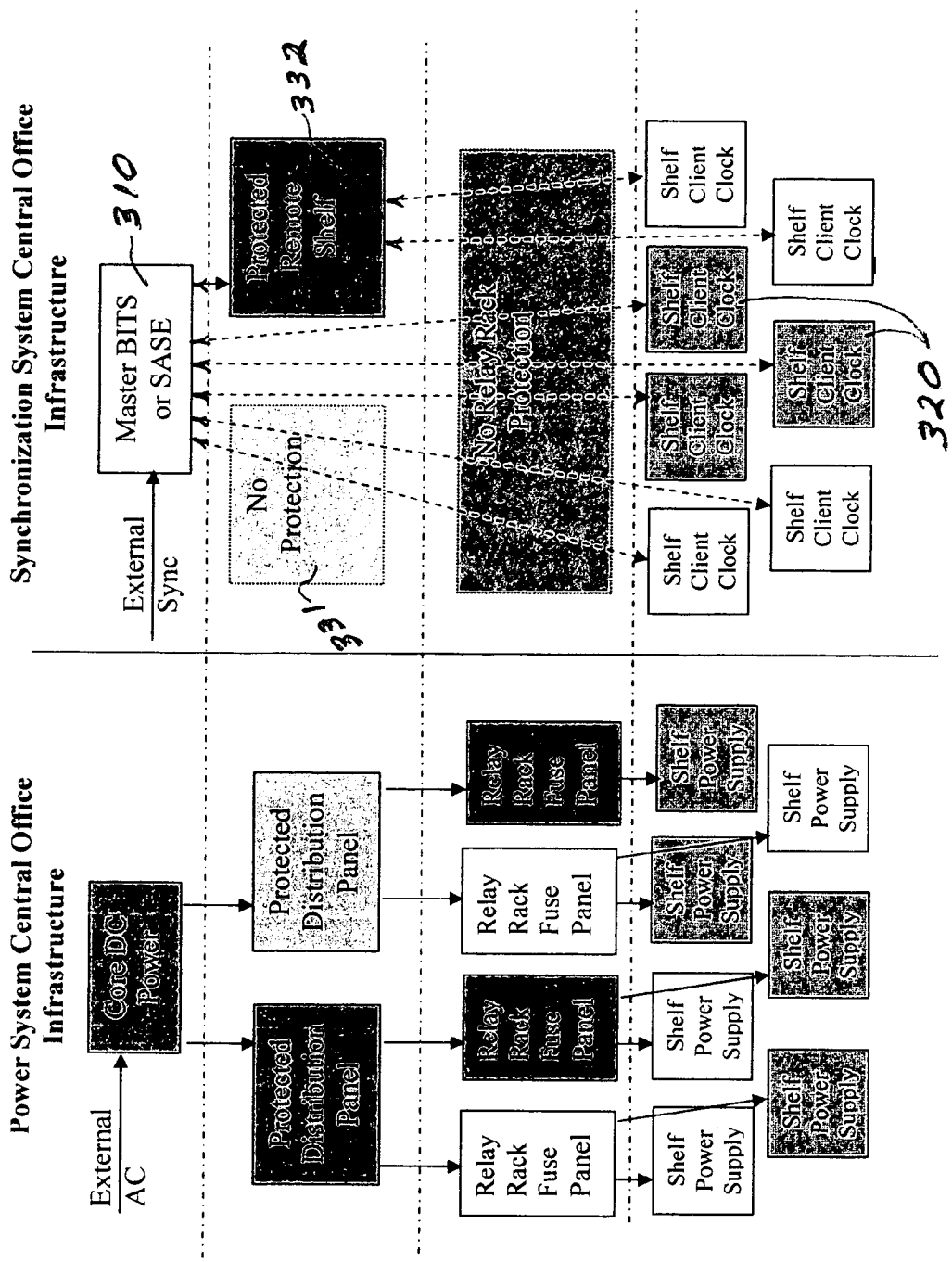
FIG. 3 is a block schematic view of differences between central office infrastructures for DC power (on the left) and a two-way synchronization implementation (on the right), representing an embodiment of the invention.

Referring to the left side of FIG. 3, power systems include a core DC power plant. The principle function is to provide a single point of interface for external AC power and covert to the required DC power. Of course, the DC power plant serves as a firewall to protect the office from surges and outages associated with outside power. It also serves as a flywheel (with both batteries and auxiliary generators) to maintain power service if external power is interrupted.

The power system also defines an (upside down) tree topology distribution infrastructure. This includes distribution panels throughout each central office with protection and individual fused distribution assemblies at the top of the relay racks the house the telephony equipment. Finally there are individual isolated power supplies associated with each shelf and/or each plug-in in the NEBS compliant equipment.

Referring to the right side of FIG. 3, an external synchronization signal is provided to a master BITS or SASE 310. The master BITS or SASE 310 is two-way timing protocol coupled to a plurality of shelf client clocks 320. A first distribution panel 331 has no timing protection. A second distribution panel 332 is two-way timing protocol coupled to the master BITS or SASE 310. In this particular example, there is no relay rack timing protection.

This master timing signal generator provides a single point of interface for external synchronization references to the central office and generates the required number and types of output references. As previously discussed, the external reference maybe from an upstream office or directly from a UTC traceable collocated PRS. Like the core DC power plant, is serves as a firewall to protect the offices from external timing anomalies and outages. It also serves a flywheel function (with calibrated precise local oscillators) to maintain uninterrupted synchronization service to the office.

The synchronization system also includes a distribution infrastructure. The original BITS concept was a simple star topology with every network element directly homed back to the master BITS. This topology places excessive dependence on the master BITS since it is a potential single point of failure. Aging equipment, maintenance or provisioning activity, environmental effects (e.g., temperature, surges, etc.) can contribute to master failures or outages, and FCC reportable events have been documented.

Even though there have been remote shelves deployed in larger central offices, the primary motivation was extended distribution and shelves are largely either unprotected or minimally protected. Finally the synchronization distribution is terminated at a common equipment client shelf clock. Under best practices, the client clock will receive a primary and secondary reference over independent cables homed back on the master or remote clock shelf.

Figure 4:
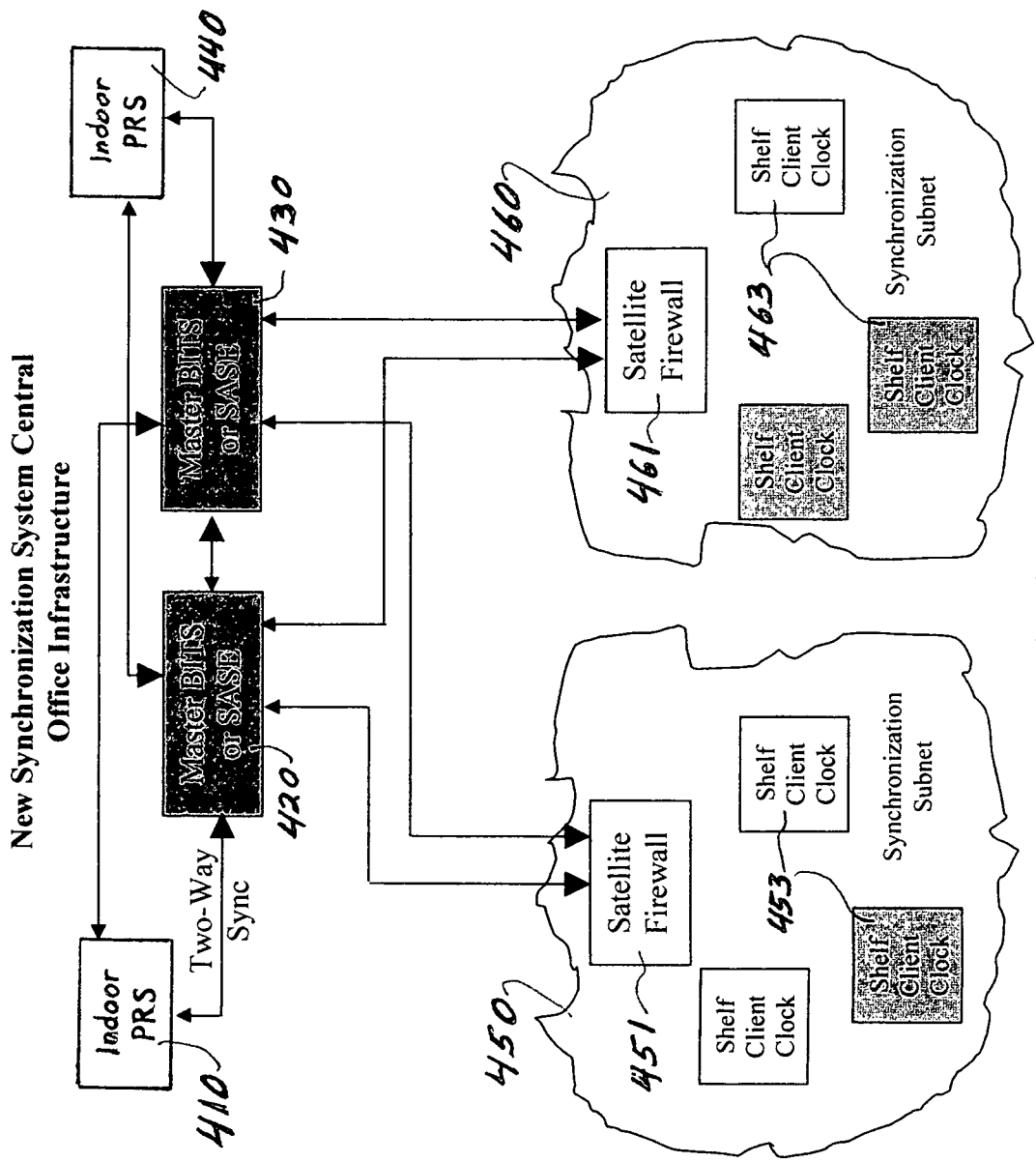
FIG. 4 is a block schematic view of a dual indoor PRS two-way timing protocol implementation, representing an embodiment of the invention.

Referring to FIG. 4, a first indoor PRS 410 is two-way timing protocol coupled to both a first master BITS or SASE 420 and a second master BITS or SASE 430. A second indoor PRS is also two-way timing protocol coupled to both the first master BITS or SASE 420 and the second master BITS or SASE 430. Both the first master BITS or SASE 420 and the second master BITS or SASE 430 are two-way timing protocol coupled to a first synchronization subnet 450. The first synchronization subnet 450 includes a first satellite firewall 451 and a plurality of shelf client clocks 453. Similarly, both the first master BITS or SASE 420 and the second master BITS or SASE 430 are two-way timing protocol coupled to a second synchronization subnet 460. The second synchronization subnet 460 includes a first satellite firewall 461 and a plurality of shelf client clocks 463.

Using the two-way protocol embodiment of the invention, intra-office synchronization distribution can be enhanced to improve both the robustness and manageability of the office synchronization services. The ability of the protocol to permit absolute time alignment of all the synchronization equipment enables the realization of the "dual BITS concept". Service suppliers such a BellSouth have requested this dual master architecture, but without a secure method to ensure both frequency and time alignment, the second master could not be operated sufficiently decoupled from the primary master. However, combined with PRS systems that use the two-way timing protocol, robust independent performance can be achieved. The dual master architecture will encompass adding two-way support to our current BITS products. However, it is likely that the second master may be a TimeProvider type system with lower capacity and lower cost.

Two-way timing protocol embodiments of the invention can include TODO dual bits to set the stage for implementation of reliable time of day deep into a network. The architecture show in FIG. 4 also includes satellite firewall time and frequency generators. These satellite systems are homed back to both masters with the two-way protocol. With this structure, the quality of the timing can be continuously verified to a manageable partition of client clocks termed a synchronization subnet. The satellite subnet may be implemented with either a single redundant system or two non-redundant systems strategically located. For example, a non-redundant system could be placed at either end of a relay rack lineup to partition that particular lineup as synchronization subnet. A subnet can be either a cluster of clocks in physical proximity or a group of clocks associated with a particular service (such as signaling, or ATM switching . . . ). This enables clean operational boundaries for synchronization services, and also the ability to tailor individual subnets. For example, some subnets will require precise NTP support, and potentially QOS monitoring while others will not. There are also benefits in reduced cabling cost.

Two-way timing protocol embodiments of the invention can include common PRS interface applications. The emerging indoor GPS application was discussed above. Because of its dominant position in the market, the GPS application is the focus of may indoor efforts. In more general terms the PRS applications of the invention can encompass at least the following: wall/window based GPS systems; rooftop GPS systems with RF, IF, fiber and base-band cable interfaces; Loran-C based rooftop antenna systems; indoor CDMA IS-95 based system (indirect GPS traceability); and stand alone Cesium systems with no UTC traceability.

The legacy systems include a myriad of interfaces from an antenna unit to a PRS unit. Also the only legacy defined interfaces from PRS unit to the BITS/SASE are the legacy G.703 single ended signals (T1/E1/2048 . . . ). Any PRS system that can be configured to operate indoors can greatly simplify or eliminate the antenna interface. By enhancing the interface to the BITS/SASE with the two-way timing protocol, multiple PRS can be easily integrated into a central office application. For example, the dual master arrangement discussed in the previous section can be realized since precise time can be transported from independent PRS systems. In cases where time traceability is not supported the protocol will permit the service capabilities of the PRS to be transported to the subtending client.

The two-way timing protocol embodiments of the invention are also applicable to client OEM receivers. As briefly mentioned above, there can be a large variation in the performance of a population of clocks and associated oscillators. The inconsistency in performance is inversely correlated with stratum level and associated clock technology. Stratum 2 level clocks are designed with either precision (SC or BVA) double oven oscillators or rubidium secondary atomic standards with intrinsically better resonators and better environmental shielding than the stratum 3 and 4 clocks that dominate network equipment. These stratum 3 and 4 clocks use intrinsically poorer resonators (typically AT cut) with lower quality factors. The environmental shielding is minimal. So for example, the resonator crystal is exposed to temperature effects. Also the level of screening on these lower end oscillators is minimal and not designed to ensure proper operation in telephony clock applications.

Regardless of how good the synchronization is at the input to a client clock, the potentially anomalous behavior of the oscillators embedded within the network element can be the most critical issue in the performance of the network element. This issue is even further compounded by the increasing amount of bandwidth that is dependent on the performance of these oscillators. It is important to note that the two-way protocol interface can be extended all the way to client clock receiver. The interface would include the individual common equipment clocks into the management sphere of the office synchronization infrastructure. Thus, for the first time, the actual deliver of proper synchronization service can be ensured. Also, the integrated precise NTP capabilities of the two-way protocol can provide a single converged infrastructure to support time of day applications embedded within the network element. Although preferred embodiments of the two-way protocol should be defined to support the legacy G.703 synchronization interfaces allowing a rational evolution, other non-supporting embodiments are of course possible.

The two-way timing protocol embodiments of the invention can also be applied to enhanced time pieces. This practical application could be the final extension of the two-way protocol. The current readily commercially available Time Pieces application (Symmetricom) incorporates a well-defined interface protocol between the various clock elements within an embedded clock application. A logical extension would be to incorporate a two-way protocol to extended verification from the common equipment clock cards to the individual interface cards. The protocol would also support the emerging need to distribute time of day within the embedded application.

EXAMPLE

A specific embodiment of the invention will now be further described by the following, nonlimiting example which will serve to illustrate in some detail various features. The following example is included to facilitate an understanding of ways in which an embodiment of the invention may be practiced. It should be appreciated that the example which follows represents an embodiment discovered to function well and thus can be considered to constitute a preferred mode for the practice of the invention. However, it should be appreciated that many changes can be made in the exemplary embodiment which is disclosed while still obtaining like or similar results without departing from the spirit and scope of an embodiment of the invention. Accordingly, the example should not be construed as limiting the scope of the invention.

This example relates to a field programmable gate array implementation of the two-way timing protocol embodiment in the context of a telephony application. It operates with either a single pair of wires or over a coaxial cable. The protocol is designed to operate in a half duplex mode to ensure the highest level of delay compensation by utilizing a high frame transfer rate in both directions over the exact same physical path. The bit rate for the physical layer is 2.048 MB/s. There are 256 bits per frame and the frame rate is 8.00 KHz. A bit is transmitted with an Alternate Mark Inversion (AMI) pulse that meets the requirements specified in G.703 for a 2048 Kbps date rate. Other compliant date rates such as 1544 Kbps can be supported with some minor modification of the protocol. The master (server) will transmit in even frames and will get a response from the slave (client) in the odd frames. 100 bits of the 256-bit frame will be reserved to support a minimal 5000-foot cable run. The 100 bits relates to a 48.8 μsec transmission guard time, and ensures that the return frame burst will arrive back at the server before the next even second transmit epoch even under the maximum cable distance condition. In fact, the guard-time can support over six miles of theoretical cable distance ranging.

The timing protocol frame includes the following fields:
Preamble:

The header will include a string of 18 bits as follows:
101010101010101010

After every 16 bits two 1s will be sent to prevent payload data from emulating the preamble.
Status:

The status byte is used to communicate high priority status information.
Two 1s
Frame Number:

The frame number will include 16 bits and will range from 0 to 15999. Frame number 0 indicates a even second epoch. The least significant bit of the frame count equals 125 μsec.
Two 1s
Phase Offset:

This is a 16-bit value that represents a phase offset. In the server to client direction this value is the amount of phase advance to apply to the client to compensate for one-way the cable delay and system biases. In the client to server direction this value represents the phase error reported by the main phase locked loop (MPLL).
Two 1s
Dither:

This field includes an 8-bit value that is used to pulse width modulated the LSB of the phase value on the client to allow for cable delay corrections of less than a clock cycle.
Layer 2 Spare:

This byte is reserved for future use.
Two 1s
Layer 3 Synchronous Byte 1:

The next four fields support a synchronous general-purpose 64 kbps communications link between optional host processors at each node. It is envisioned that this can be used to support higher-level management and control protocols when the two-way links are part of a larger timing network.

This field contains 8 bits to transmit the most significant byte of the word size data unit.
Layer 3 Synchronous Byte1 Valid:

This field contains two bits to indicate whether the Layer 3 synchronous byte 1 is valid data. The two bits contain identical data. Two bits are used to prevent the inadvertent generation of the preamble.
Layer 3 Synchronous Byte 2:

This field contains 8 bits to transmit the least significant byte of the word size data unit.
Layer 3 Synchronous Byte 2 Valid:

This will include two bits to indicate whether the Layer 3 synchronous byte 2 contains valid data. The two bits contain identical data. Two bits are used to prevent the accidental generation of the preamble.
IEEE1588 General Port Byte 1:

The next four fields support a 64 kbps communications link between optional host processors at each node that is dedicated to IEEE 1588 general port messages. This will enable support of standard 1588 management to operate as a standardized timing subnet.

This field contains 8 bits to transmit the most significant byte of the word size data unit.

IEEE 1588 General Port Byte 1 Valid:

This includes two bits to indicate whether IEEE 1588 byte 1 contains valid data. The two bits contain identical data. Two bits are used to prevent the accidental generation of the preamble.

IEEE1588 General Port Byte 2:

This field contains 8 bits to transmit the least significant byte of the word size data unit.

IEEE 1588 General Port Byte 2 Valid:

This will include two bits to indicate whether the Layer 3 synchronous IEEE 1588 byte 2 contains valid data. The two bits contain identical data. Two bits are used to prevent the accidental generation of the preamble.

Asynchronous Encapsulation:

This includes 1 byte which will be used to transport the 9600 baud asynchronous communication link from the timing antenna over the 2-way data link. The timing antennal will have an un-buffered UART that will connect to the GPS engine. In the up-link direction, toward the antenna, data will be throttled at ⅕ the 32 KB/s capacity of the link which will cause the up-link data rate to be limited to 6400 B/sec.

Layer 3 Asynchronous Byte Valid:

This will include two bits to indicate whether the Layer 3 asynchronous byte contains valid data. The two bits contain identical data. Two bits are used to prevent the accidental generation of the preamble.

CRC:

This will be a 16 bit CRC of the sync packet that is calculated over the Address, Status, Frame Number, Sub Frame, Dither, Link ID, and Layer 3 data. The on-time 8 khz time tick corresponds to the end of the last CRC bit, which is qualified by the CRC being valid.

Turnaround Time:

The remainder of the 256 bytes are reserved for cable delay time. The return message from the client will be delayed by 2 times the cable delay, plus the transmitter and receiver delays. The server will launch its sync packet so that the last bit of the CRC will be sent on time. The client will receive the packet and align its receive framer to the received data. The server will send its packets in even numbered frames and the client will respond in odd frames. The client will send its response using the recovered clock. The arrival time of the client reply on the server will be late by exactly 2 time the cable delay+2 times the transmitter delay+2 times the receiver delay. The server will put this delay in the phase offset position of the packet, and the client will advance its clock by this amount.

Bit Field Descriptions

The bit fields will be slightly different in the server to client and client to server direction. They are as follows:

Device Type

This will include an 8-bit value that is the device type. The device type provides a method to communicate the key timing characteristics of the sending device. A few device types are defined in the following Table 1.

TABLE 1

| Device ID | Device Name | Description |
|---|---|---|
| 0 | NULL | Unspecified device |
| 1 | Client Type 1 Oscillator | Client with a type 1 Holdover oscillator |
| 2 | Client Type 2 Oscillator | Client with Stratum 2 (Type 2) Holdover oscillator |
| 3 | Client Type 3 Oscillator | Client with Stratum 3E (Type 3) Holdover oscillator |
| 4 | Client Type 4 Oscillator | Client with Stratum 3 (Type 4) Holdover oscillator |
| ... | | |
| 11 | PRS | G.811 GR2830 Compliant PRS (stratum 1) Clock |
| ... | | |
| FF | Timing Antenna | UTC Radio Traceable Timing Source (e.g.) GPS with minimal holdover |

Status

These 8 bits will contain status and control information in the server to client direction. They are defined in the following Table 2.

TABLE 2

| Bit | Description (Server to Client) |
|---|---|
| 0 | PLL converged |
| 1 | Spare |
| 2 | Spare |
| 3 | Spare |
| 4 | Spare |
| 5 | Spare |
| 6 | Spare |
| 7 | Spare |

These 8 bits will contain status and control information in the server to client direction. They are defined in the following Table 3.

TABLE 3

| Bit | Description (Client to Server) |
|---|---|
| 0 | Spare |
| 1 | Spare |
| 2 | Spare |
| 3 | Spare |
| 4 | Spare |
| 5 | Spare |
| 6 | Spare |
| 7 | Spare |

Frame Number

These 16 bits contain the frame number. There are 8000 8 KHz frames in the 1 second multiframe which are numbered 0 to 7999. Frame 0 is where the pulse per second will exist. Both the client and the server will have frame counters that are incremented at 8.00 KHz. The client will receive the frame number from the server and will automatically align its counter to the server if the CRC is valid.

Phase Offset

The server will send a unsigned phase correction to the client in these 16 bits. The phase correction is in 117.9648 MHz clock cycles.

In the client to server direction, these bits will be a signed 16 bit number that represents the phase error in the client MPLL. Normally this number should be very close to zero. The server can use this number to determine the health of the client.

Dither

In the server to client direction this is an 8 bit dither value that can be used to adjust the phase of the client in 1/256ths of a 117.9648 MHz clock cycle.

In the client to server direction these bits are reserved for future use and will be filled with 1s.

Spare Byte

This is a spare byte that transfer will be sent at half the frame rate.

Layer 3 Synchronous Byte 1

These bits contain 8 bits of synchronous data. These bits are only valid if the Layer 3 Sync Byte 1 Valid bit is set.

The synchronous data link provides for microprocessor communication up and down the chain of SMCBs. There are 32 byte FIFOs that buffer the transmit and receive data. If the transmit FIFO is not empty, a byte is read from it and inserted into this byte and the Sync Byte 1 valid bit is set.

Layer 3 Sync Byte 1 Valid

This field includes 2 bits. The two bits contain the same data which will prevent the payload data from containing a preamble. These bits are set if Layer 3 Synchronous byte 1 contains valid data.

Layer 3 Synchronous Byte 2

These bits contain 8 bits of synchronous data. These bits are only valid if the Layer 3 Sync byte 2 Valid bit is set.

The synchronous data link provides for microprocessor communication up and down the chain of SMCBs. There are 32 byte FIFOs that buffer the transmit and receive data. If the transmit FIFO is not empty, a byte is read from it and inserted into this byte and the Sync Byte 1 valid bit is set.

Layer 3 Sync Byte 2 Valid

This field includes 2 bits. The two bits contain the same data which will prevent the payload data from containing a preamble. These bits are set if Layer 3 Synchronous byte 2 contains valid data.

Layer 3 IEEE 1588 Byte 1

This is an 8 bit field that is reserved to send IEEE 1588 data. It is not used in the SMCB.

Layer 3 IEEE 1588 Byte 1 Valid

These two bits are used to validate the data in Layer 3 IEEE 1588 byte 1. They are not used in the SMCB.

Layer 3 IEEE 1588 Byte 2

This is an 8 bit field that is reserved to send IEEE 1588 data. It is not used in the SMCB.

Layer 3 IEEE 1588 Byte 2 Valid

These two bits are used to validate the data in Layer 3 IEEE 1588 byte 2. They are not used in the SMCB.

Layer 3 Asynchronous Data

These 8 bits contain the ASYNC data from the GPS receiver. A UART in the antenna fills this field and sets the Async Valid bit when it receives a byte. The Uart data is buffered by a 32 byte FIFO on the SMCB.

In the transmit direction, there is also a 32 byte FIFO. Since there is no FIFO in the antenna, the data can be sent up to the antenna at no more than 9600 bits per second. To accommodate this, a byte is read from the transmit FIFO in every 5th frame only. This limits the async data to the antenna to 6400 bits per second.

Layer 3 Async Valid

This field includes 2 bits. The two bits contain the same data which will prevent the payload data from containing a preamble. These bits are set if Layer 3 Asynchronous byte contains valid data.

CRC16

The last 16 bits are the CRC which is used to validate the frame. If the CRC is invalid the frame is thrown out and the client will not respond back to the server.

Turn Around Buffer

These 98 bits are the turnaround time for the cable delay measurement. They will always be 0.

Serial Interface

The serial interface between the server and the client will be a half duplex alternate mark inversion signal at a rate of 2.048 MB/s. The amplitude will initially be set at 2.5Vpp. In the receive direction there will be an 8 bit A to D converter that will digitize the receive data. The AGC will be done digitally inside the FPGA.

The transmitter will include a switched current source that will produce the AMI signal across the terminating resistor. Since a current source has essentially an infinite impedance, the transmitter will simply send constant zeros during the period in which it is suppose to be receiving data. This will provide a good impedance match to the cable for both the transmitter and the receiver.

While transmitting data out, the peak value of the AGC (a digital value inside the FPGA) is frozen so that the receiver will not AGC on the hot transmit signal.

Receive Bit Rate Frequency Synthesis

A digital PLL will be used to recover a 2.048 MHz clock from the receive sync packet data stream. When the client is transmitting, the clock recovery signal will be blocked, and the AGC peak detector in the slicer circuit will not be updated. The DPLL will align the rising edge of the recovered clock with the rising edge of the sync data stream. The flipflop will function as a phase comparator and will select a frequency that is either 1 ppm high or low depending on the phase relationship between serial data and the synthesized clock. A clock enable signals will be generated that correspond to the rising and falling edges of the recovered clock that is 1 period of the high frequency system clock.

This recovered clock will also be used to run the transmitter. The rising edge CE will be used to send out the data which will be phase aligned with the data received from the server.

The 8 KHz reference input of this example will now be described. The 8 KHz reference will be recovered from a live T1 ore E1 signal. It will be filtered by an IPLL circuit and then sampled by a phase measurement circuit. The phase measurement circuit will hand its data off to a microprocessor which will provide the clock function.

Figure 5:
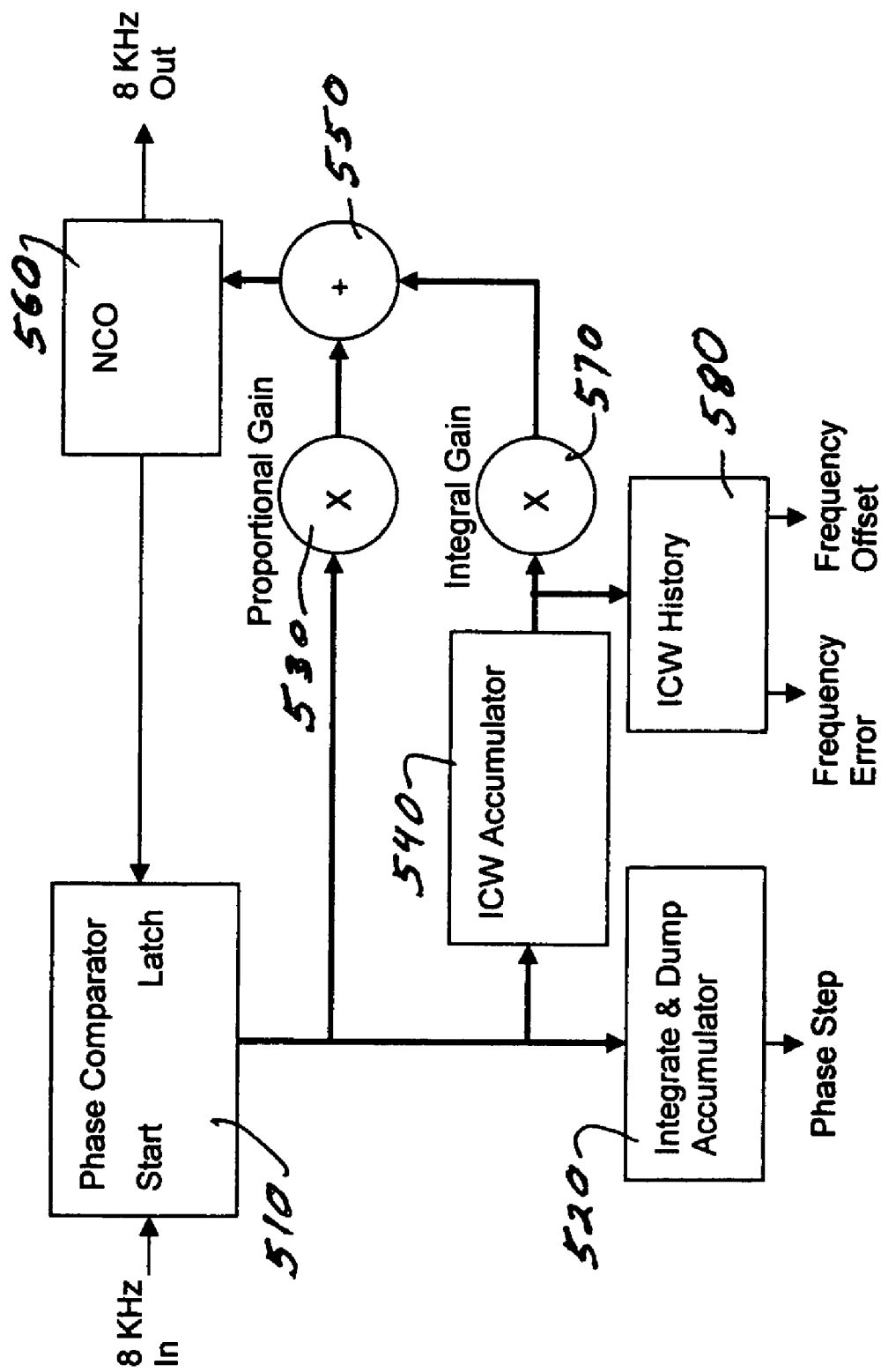
FIG. 5 is a block schematic view of an input phase lock loop, representing an embodiment of the invention.

The 8 Khz Input PLL of this example will now be described. Referring to FIG. 5, a block diagram of the input PLL is shown. A phase comparator 510 is coupled to an integrate & dump accumulator 520, having a phase step output. The phase comparator 510 is also coupled to a proportional gain block 530. The phase comparator 510 is also coupled to an ICW accumulator 540. The proportional gain block 530 is coupled to a summation block 550. The summation block 550 is coupled to a numerically controlled oscillator 560. The numerically controlled oscillator 560 is coupled to the phase comparator 510. The ICW accumulator 540 is coupled to an integral gain block 570. The integral gain block 570 is coupled to the summation block 550. The ICW accumulator 540 is also coupled to an ICW history block 580, having a frequency error output and a frequency offset output.

The input PLL is a digital PLL with a time constant of about 1 second. It uses a proportional/integral type filter which locks with no steady state phase error. It removes jitter from the input to minimize phase steps when reference switching. The input PLL also monitors the input signal for phase steps, frequency offsets, and frequency errors and sends this information to the microprocessor.

Figure 6:
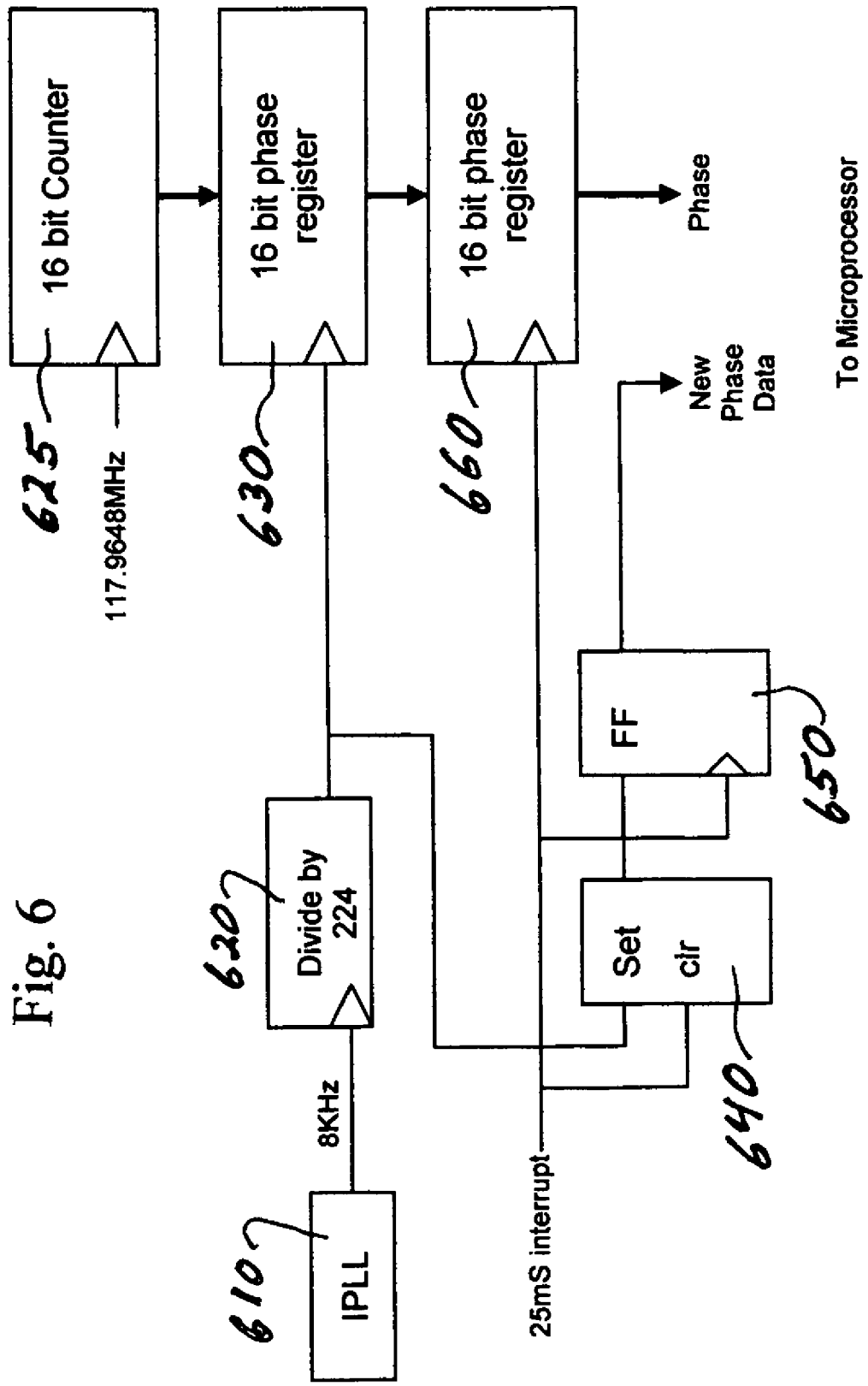
FIG. 6 is a block schematic view of a reference phase measurement, representing an embodiment of the invention.

The 8 KHz reference phase measurement of this example will now be described. Referring to FIG. 6, an input phase lock loop 610 is coupled to a divide by 224 block 620. An output of the divide by 224 block 620 is coupled to a first 16 bit phase register 630. A 16 bit counter 625 is coupled to the first 16 bit register 630; and the first 16 bit register 630 is coupled to a second 16 bit register 660, having a phase output to a microprocessor. The output of the divide by 224 block 620 is also coupled to a set cir block 640. The set cir block 640 is coupled to a ff block 650, having a new phase data output to the microprocessor. A 25 mS interrupt signal is coupled to all of the set cir block 640, the ff block 650 and the second 16 bit phase register 660.

The phase of the 8 KHz reference will be measured against the system clock and handed off to the microprocessor. When using the 8 KHz reference the clock will be implemented in software, and the microprocessor code will write the EFC value to the 10 MHz OCXO. The 8 KHz is divided by 224 to create a 35.7 Hz strobe. The 35.7 Hz strobe will sample a free running 16 bit counter that is clocked by 117.9648 MHz that is generated by the synthesizer in the MPLL. When a phase sample is available a flag will be set that will be read by the 25 mS interrupt service routine, and if a phase sample is available, it to will be read.

The GPS interface of this example will now be described. The GPS interface will connect to the upstream 2-way interface. The GPS signal will be received by a timing antenna that will directly support the 2-way timing protocol or from an adapter that will translate the timing antenna to a 2-way protocol. The pulse per second from the GPS will be extracted and will run a hardware clock. The hardware clock will directly supply a value to the Delta Sigma DAC that runs the EFC on the 10 MHz OCXO.

MPLL

The system clock will include a Stratum 3E type clock that will steer the OCXO using a Delta Sigma A to D converter. If the system is using GPS as a reference, the pulse per second from the GPS engine will lock a hardware frequency locked loop with Stratum 3E time constants. If 8 KHz is selected as a clock reference, the microprocessor will receive phase information from the FPGA and will use this phase information to implement a software clock in the microprocessor code. The microprocessor will be able to write frequency control values to the Delta Sigma DAC controlling the EFC of the 10 MHz OCXO.

2.048 MHz Output Generator

The 2.048 MHz output will come from a pure digital phase locked loop and will use a digital NCO that will swallow clock cycles to achieve the 2.048 MHz. This will cause the 2.048 MHz output to have 8.5 nS of cycle to cycle jitter, which is 1 cycle of the 117.9648 MHz clock. The 117.9648 MHz clock is a doubled 58.9824 MHz clock. The 2.048 MHz PLL can be locked to the system 58.9824 MHz clock or the 8 KHz input. The selection is under microprocessor control.

1.544 MHz Output Generator

The 1.544 MHz output will come from a pure digital phase locked loop and will use a digital NCO that will swallow clock cycles to achieve the 1.544 MHz. This will cause the 1.544 MHz output to have 8.5 nS of cycle to cycle jitter, which is 1 cycle of the 117.9648 MHz clock. The 117.9648 MHz clock is a doubled 58.9824 MHz clock. The 1.544 MHz PLL can be locked to the system 58.9824 MHz clock or the 8 KHz input. The selection is under microprocessor control. Referring to FIGS. 7A and 7B, the register details will now be described.

Control Register 1 (Read/Write) 0X00

Bit 0: Lock 2048/1544

Setting this bit to 1 will cause the 2.048 MHz and 1.544 MHz outputs to track the phase of the 8 KHz reference input. Setting it to zero will frequency lock the 2.048 MHz and 1.544 MHz signals to the clock.

Bit 1: PPS_Mask

This bit, when set to 1 will allow the pulse per second to propagate to the PP2S output. To generate an even second pulse, the microprocessor needs to toggle this bit a ½ Hz rate. When bit 4 of status register 3 is high during the interrupt service routine, this bit should be toggled to generate the even second pulse. To mask the signal, this bit should just be set to 0.

Bit 2: Freerun

This bit, when set to 1 will cause the clock to freerun at the calibration EFC value that has been written to the EFC_VALUE register at address 0X1C & 0X1D.

Bit 3: Holdover

This bit, when set to 1 will cause the clock to enter holdover. In holdover, a 30 second history value of the EFC will be applied. This bit is only functional when the SMCB is operating in the GPS mode.

Bit 4: GPS/8 KHZ Mode

This bit selects the operating mode of the clock. When this bit is set to 1 the clock will operate in the 8 KHz mode. In the 8 KHz mode, the microprocessor locks the loop by measuring phase and calculating an EFC value. The value written to the EFC VALUE register is directly applied to the oscillator.

When this bit is set to 0, the clock will be locked to the two-way signal that is applied to the upstream input. This lock is done in hardware. The holdover value applied to the EFC is also derived in hardware.

Control Register 2 (Read/Write) 0X01

Bit 0: PLL Unlock Clear

Pulsing this bit will clear the latched PLL lock detectors for all the PLLs.

Bit 1: PPS Align

When this bit is set to 1, the pulse per second and even second pulse will be aligned to the GPS pulse per second. When set to 0, the clock will frequency lock to the GPS pulse per second Other bits not used.
    Control Register 3 (Read/Write) 0X02

This register is reserved for future use
    Status Register 1 (Read) 0X03

This register indicates the state of the 8 KHz reference. The bits are defined as follows:

Bit 0: 8 KHz Reference Loss Of Signal

A 1 indicates that no signal is present on the 8 KHz input.

Bit 1: 8 KHz Reference Phase Error

A 1 indicates that a phase transient has been detected on the input

Bit 2: 8 KHz Reference IPLL Not Settled

A 1 indicates that the IPLL filter on the 8 KHz reference has not settled to 1 uS phase error.

Bit 3: 8 KHz Reference Frequency Error

A 1 indicates that there is a frequency error on the 8 KHz reference greater than 5-6

Bit 4: Unlock 58M

A 1 indicates that the 58.9824 MHz PLL has unlocked. The unlock event is latched until the microprocessor clears it. To clear an unlock event, bit 1 of control register 2 is pulsed high.

Bit 5: Unlock 78M

A 1 indicates that the 58.9824 MHz PLL has unlocked. The unlock event is latched until the microprocessor clears it. To clear an unlock event, bit 1 of control register 2 is pulsed high.

Bit 6: LOS 58M

A 1 indicates a loss of signal from the 58.9824 MHz VCXO. This means that less than 5 clock edges have occurred in a period of the 10 MHz reference oscillator.

Bit 7: LOS 78M

A 1 indicates that the 78.6432 MHz PLL has unlocked. The unlock event is latched until the microprocessor clears it. To clear an unlock event, bit 1 of control register 2 is pulsed high.
    Status Register 2 (Read) 0X04

This register reports the status of the Main PLL (GPS mode)

Bit 1: Skip Jam (Holdover Recovery)

A 1 indicates that the hardware loop is recovering from a holdover and will not re-trip into holdover on a phase error.

Bit 2: Holdover

A 1 indicates that the MPLL is in holdover and is not tracking the input. This is usually due to an input being disqualified for some reason.

Bit 3: MPLL Extended Lock

The MPLL is locked with a phase error less than 10 uS. This occurs when the loop is initially locking and should clear after a short time.

Bit 4: MPLL Tight Lock

The MPLL is locked with a phase error less than 1 uS. This is the normal mode of operation.

Bits 5-7: Not Used
    Status Register 3 (Read) 0X05

This register reports the state of the MPLL

Bits 1:0: MPLL Mode

00 Freerun (running off of uncorrected LO)

01 Holdover (running off of corrected LO)

10 Fast mode (Stratum mode w phase buildout)

11 Slow mode (Stratum mode w phase buildout)

Bits 3:2: Reserved

Bit 4: PPS Time

A 1 indicates that the current 25 mS interrupt is on a 1 second boundary

Bit 5: PP2S Time

A 1 indicates that the current 25 mS interrupt is on an even second boundary

Bit 7:6: Not Used
    2-Way Comms Status (Read) 0X06

Bit 0: Upstream UART RX FIFO Empty

A 1 indicates that the UART FIFO that is receiving 9600 baud data from the GPS timing antenna is empty, and that reading the Upstream UART Receive data will return invalid data. The receive FIFO is 32 bytes deep, and must be serviced on every 25 mS interrupt to prevent data loss.

Bit 1: Upstream UART TX FIFO Full

A 1 indicates that the UART FIFO for outgoing messages to the GPS antenna is full. Writing further data to the Upstream UART Transmit data register will be lost.

Bit 2: Upstream SDCL RX FIFO Empty

A 1 indicates that there is no SDLC data in the receive FIFO. Further reading of the Upstream SDLC receive register will return invalid data. The SDLC FIFO is 256 bytes deep.

Bit 3: Upstream SDLC TX FIFO Full

A 1 indicates that the upstream SDLC FIFO is full, and that further writing to the Upstream SDLC transmit register will result in lost data. The SDLC FIFO is 256 bytes deep.

Bit 4: Downstream SDCL RX FIFO Empty

A 1 indicates that there is no SDLC data in the receive FIFO. Further reading of the Downstream SDLC receive register will return invalid data. The SDLC FIFO is 256 bytes deep.

Bit 5: Downstream SDLC TX FIFO Full

A 1 indicates that the downstream SDLC FIFO is full, and that further writing to the downstream SDLC transmit register will result in lost data. The SDLC FIFO is 256 bytes deep.

Bit 6: Upstream SDLC Transmit Enable

This bit will echo back the 2-way comms control register.

Bit 7: Downstream SDLC Transmit Enable

This bit will echo back the 2-way comms control register.
    2-Way Comms Control (Write) 0X06

Bit 5:0: Not Used

Bit 6: Upstream SDLC Transmit Enable

After the upstream SDLC FIFO has been filled with a message, this bit should be pulsed high to initiate the send. If this bit is left in a high state, the SDLC circuit will send each byte as it is written.

Bit 7: Downstream SDLC Transmit Enable

After the upstream SDLC FIFO has been filled with a message, this bit should be pulsed high to initiate the send. If this bit is left in a high state, the SDLC circuit will send each byte as it is written.

Upstream UART Transmit Data (Write) 0X07

This register writes GPS comms data into the Upstream UART transmit FIFO. The FIFO is 32 bytes deep. The 2-WAY COMMS STATUS register should be checked to make sure that the transmit FIFO does not overflow.

Upstream UART Receive Data (Read) 0X07

This register reads GPS data from the Upstream UART receive FIFO. The FIFO is 32 bytes deep. The UPSTREAM UART RX FIFO EMPTY bit of the 2-WAY COMMS STATUS register needs to be checked after each read to make sure that there is still valid data in the FIFO.

Upstream SDLC Transmit Data (Write) 0X08

This register writes SDLC comms data into the Upstream SDLC transmit FIFO. The FIFO is 256 bytes deep. The 2-WAY COMMS STATUS register should be checked to make sure that the transmit FIFO does not overflow. To guarantee that the whole packet is sent out intact, the UPSTREAM SDLC TRANSMIT ENABLE bit of the 2-WAY COMMS CONTROL register should be set low while filling the transmit FIFO, and then set high to initiate the transmission.

Upstream SDLC Receive Data (Read) 0X08

This register reads data from the Upstream SDLC receive FIFO. The FIFO is 256 bytes deep. The UPSTREAM SDLC RX FIFO EMPTY bit of the 2-WAY COMMS STATUS register needs to be checked after each read to make sure that there is still valid data in the FIFO.

Downstream SDLC Transmit Data (Write) 0X09

This register writes SDLC comms data into the Downstream SDLC transmit FIFO. The FIFO is 256 bytes deep. The 2-WAY COMMS STATUS register should be checked to make sure that the transmit FIFO does not overflow. To guarantee that the whole packet is sent out intact, the DOWNSTREAM SDLC TRANSMIT ENABLE bit of the 2-WAY COMMS CONTROL register should be set low while filling the transmit FIFO, and then set high to initiate the transmission.

Downstream SDLC Receive Data (Read) 0X09

This register reads data from the Downstream SDLC receive FIFO. The FIFO is 256 bytes deep. The DOWNSTREAM SDLC RX FIFO EMPTY bit of the 2-WAY COMMS STATUS register needs to be checked after each read to make sure that there is still valid data in the FIFO.

Interrupt Counter (Read) 0X0A

This register is a counter that is incremented every on every 25 mS interrupt. It can be read as part of the interrupt service routine to check that no interrupts have been missed. This register has no affect on the operation of the FPGA.

Upstream Source Address (Read/Write) 0X0B

The data written to this byte will be sent out in the source address field of the 2-Way Upstream data. The data read from this register comes from device connected to the 2-Way Upstream connector.

Upstream Status Byte (Read/Write) 0X0C

The data written to this byte will be sent out in the status field of the 2-Way Upstream data. The data read from this register comes from the device connected to the 2-Way Upstream connector.

Upstream Phase Correction (Read) 0X0E/0X0F

This register contains the 16 bit phase correction value that was sent from the timing server connected to the 2-Way Upstream connector. The phase correction is in clock cycles of the timing server. From this data, the cable length between the server and this module is known.

Upstream Phase Correction Dither (Read) 0x10

This register contains the 8 bit dither value of the phase correction value that was sent from the timing server. The dither value represents the fraction of a clock cycle period correction that is applied to the cable length.

Upstream Spare Byte (Read/Write) 0X11

The data written to this register will be sent out in the SPARE field of the 2-Way Upstream data. The data read from this register is the device connected to the 2-Way Upstream connector.

Downstream Source Address (Read/Write) 0X12

The data written to this byte will be sent out in the source address field of the 2-Way Downstream data. The data read from this register comes from device connected to the 2-Way Downstream connector.

Downstream Status Byte (Read/Write) 0X13

The data written to this byte will be sent out in the status field of the 2-Way Downstream data. The data read from this register comes from the device connected to the 2-Way Downstream connector.

Downstream Sent Phase Correction (Read) 0x14/0X15

The unsigned 16 bit phase correction that is being applied to the downstream timing client is read from this register. The correction is in 117.9684 clock cycles.

Downstream Sent Phase Dither (Read) 0x16

The 8 bit dither value, that represents a fraction of a 117.9648 clock cycle period for the timing client to apply to the cable delay correction, is read from this register.

Downstream Received Phase Error (Read) 0X18/0X19

The data read from this 16 bit register is the signed phase error of the timing client MPLL. From this data the performance of the timing client can be monitored.

Downstream Spare Byte (Read/Write) 0X1A

The data written to this register will be sent out in the SPARE field of the 2-Way Downstream data. The data read from this register is the device connected to the 2-Way Downstream connector.

EFC Value (Read/Write) 0X1C/0X1D

The unsigned 16 bit value written to this register will be used to control the EFC voltage on the 10 MHz OCXO when the clock is using the 8 KHz reference. A larger value represents a higher frequency. The value read from this register is the EFC value being applied to the OCXO. When the clock is tracking the GPS input or 2-Way timing input, the EFC value will be from the hardware clock.

8 KHz Input Phase (Read) 0X1E/0X1F

The unsigned 16 bit value from the 8 KHz phase measurement circuit is read from this register. The MSB of this register is set to 1 when there is phase data. Bits 14:0 are the actual phase value. This value is updated at a 35.7 Hz rate. This register needs to be checked every 25 mS interrupt, and there should be phase data 90% of the time.

GPS Phase (Read) 0X20/0X21

The signed 16 bit GPS phase is read from this register. The MSB is a flag that indicates the phase is out of the measurement range when is set. Bits 14:0 are the signed phase error in the GPS pulse per second measurement.

If the TOO FAR flag is set, it is recommended that a phase jam be applied to the GPS phase circuit force it into alignment. This is done by asserting the PPS JAM bit in Control register 2 for at least 1 second.

FPGA Revision (Read) 0X30

The FPGA revision is read from this register. It is a hard coded value in the FPGA. Referring to FIGS. 8A and 8B, the field programmable gate array pin descriptions are enumerated. The particular pin number assignments are merely a function of the specific FPGA chosen to embody this example in a tangible form.

DEFINITIONS

The term program and/or the phrase computer program are intended to mean a sequence of instructions designed for execution on a computer system (e.g., a program and/or computer program, may include a subroutine, a function, a procedure, an object method, an object implementation, an executable application, an applet, a servlet, a source code, an object code, a shared library/dynamic load library and/or other sequence of instructions designed for execution on a computer or computer system). The phrase radio frequency is intended to mean frequencies less than or equal to approximately 300 GHz as well as the infrared spectrum.

The term substantially is intended to mean largely but not necessarily wholly that which is specified. The term approximately is intended to mean at least close to a given value (e.g., within 10% of). The term generally is intended to mean at least approaching a given state. The term coupled is intended to mean connected, although not necessarily directly, and not necessarily mechanically. The term proximate, as used herein, is intended to mean close, near adjacent and/or coincident; and includes spatial situations where specified functions and/or results (if any) can be carried out and/or achieved. The term deploying is intended to mean designing, building, shipping, installing and/or operating.

The terms first or one, and the phrases at least a first or at least one, are intended to mean the singular or the plural unless it is clear from the intrinsic text of this document that it is meant otherwise. The terms second or another, and the phrases at least a second or at least another, are intended to mean the singular or the plural unless it is clear from the intrinsic text of this document that it is meant otherwise. Unless expressly stated to the contrary in the intrinsic text of this document, the term or is intended to mean an inclusive or and not an exclusive or. Specifically, a condition A or B is satisfied by any one of the following: A is true (or present) and B is false (or not present), A is false (or not present) and B is true (or present), and both A and B are true (or present). The terms a or an are employed for grammatical style and merely for convenience.

The term plurality is intended to mean two or more than two. The term any is intended to mean all applicable members of a set or at least a subset of all applicable members of the set. The phrase any integer derivable therein is intended to mean an integer between the corresponding numbers recited in the specification. The phrase any range derivable therein is intended to mean any range within such corresponding numbers. The term means, when followed by the term "for" is intended to mean hardware, firmware and/or software for achieving a result. The term step, when followed by the term "for" is intended to mean a (sub)method, (sub)process and/or (sub)routine for achieving the recited result.

The terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. The terms "consisting" (consists, consisted) and/or "composing" (composes, composed) are intended to mean closed language that does not leave the recited method, apparatus or composition to the inclusion of procedures, structure(s) and/or ingredient(s) other than those recited except for ancillaries, adjuncts and/or impurities ordinarily associated therewith. The recital of the term "essentially" along with the term "consisting" (consists, consisted) and/or "composing" (composes, composed), is intended to mean modified close language that leaves the recited method, apparatus and/or composition open only for the inclusion of unspecified procedure(s), structure(s) and/or ingredient(s) which do not materially affect the basic novel characteristics of the recited method, apparatus and/or composition.

Unless otherwise defined, all technical and scientific terms used herein have the same meaning as commonly understood by one of ordinary skill in the art to which this invention belongs. In case of conflict, the present specification, including definitions, will control.

CONCLUSION

The described embodiments and examples are illustrative only and not intended to be limiting.

Although embodiments of the invention can be implemented as a separate module, embodiments of the invention may be integrated into the system(s) with which they are associated. All the disclosed embodiments of the invention disclosed herein can be made and used without undue experimentation in light of the disclosure. Although the best mode of embodiments of the invention contemplated by the inventor(s) is disclosed, embodiments of the invention is not limited thereto. Embodiments of the invention are not limited by theoretical statements (if any) recited herein. The individual steps of embodiments of the invention need not be performed in the disclosed manner, or combined in the disclosed sequences, but may be performed in any and all manner and/or combined in any and all sequences, The individual components of embodiments of the invention need not be formed in the disclosed shapes, or combined in the disclosed configurations, but could be provided in any and all shapes, and/or combined in any and all configurations. The individual components need not be fabricated from the disclosed materials, but could be fabricated from any and all suitable materials.

It can be appreciated by those of ordinary skill in the art to which embodiments of the invention pertain that various substitutions, modifications, additions and/or rearrangements of the features of embodiments of the invention may be made without deviating from the spirit and/or scope of the underlying inventive concept. All the disclosed elements and features of each disclosed embodiment can be combined with, or substituted for, the disclosed elements and features of every other disclosed embodiment except where such elements or features are mutually exclusive. The spirit and/or scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

What is claimed is:

1. A method of estimating a time error between a first clock at a first node and a second clock at a second node, comprising:

sending a first node time value from the first node to the second node over a physical layer transport that is coupled to the first and second nodes;

sending a second node time value from the second node to the first node over the physical layer transport; and determining an estimate of the time error between the first clock and the second clock based on a first time interval value and a second time interval value, wherein the first time interval value represents a difference between the second node time value and a clock value of the first clock at the time the first node received the second node time value, and the second time interval value represents a difference between the first node time value and a clock value of the second clock at the time the second node received the first node time value.

2. The method of claim 1, wherein the estimated time error between the first clock and the second clock, as determined, is further based on a first node transmit delay (dt1), a first node receive delay (dr1), a second node transmit delay (dt2), and a second node receive delay (dr2).

3. The method of claim 2, wherein the estimated time error is calculated as: $(TIC1-TIC2)/2-(dt2-dt1+dr1-dr2)/2$, wherein TIC1 corresponds to the first time interval value and TC2 corresponds to the second time interval value.

4. The method of claim 3, wherein the estimated time error is calculated using a field programmable gate array.

5. The method of claim 1, wherein the second node sends the second time interval value to the first node and the estimated time error is calculated at the first node.

6. A method of estimating a latency in a physical layer transport that is coupled between a first node having a first clock and a second node having a second clock, comprising:

sending a first node time value from the first node to the second node over the physical layer transport;

sending a second node time value from the second node to the first node over the physical layer transport; and determining an estimate of the latency in the physical layer transport based on a first time interval value and a second time interval value, wherein the first time interval value represents a difference between the second node time value and a clock value of the first clock at the time the first node received the second node time value, and the second time interval value represents a difference between the first node time value and a clock value of the second clock at the time the second node received the first node time value.

7. The method of claim 6, wherein the estimated latency in the physical layer transport, as determined, is further based on a first node transmit delay (dt1), a first node receive delay (dr1), a second node transmit delay (dt2), and a second node receive delay (dr2).

8. The method of claim 7, wherein the estimated latency is calculated as: $(TIC1+TIC2)/2-(dt2+dt1+dr1+dr2)/2$, wherein TIC1 corresponds to the first time interval value and TC2 corresponds to the second time interval value.

9. The method of claim 8, wherein the estimated latency is calculated using a field programmable gate array.

10. The method of claim 6, wherein the second node sends the second time interval value to the first node and the estimated latency is calculated at the first node.

* * * * *